United States Patent
Chang et al.

(10) Patent No.: US 11,276,819 B2
(45) Date of Patent: **\*Mar. 15, 2022**

(54) METAL LANDING ON TOP ELECTRODE OF RRAM

(71) Applicant: Taiwan Semiconductor Manufacturing Co., Ltd., Hsin-Chu (TW)

(72) Inventors: Chih-Yang Chang, Yuanlin Township (TW); Wen-Ting Chu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/587,218

(22) Filed: Sep. 30, 2019

(65) Prior Publication Data

US 2020/0028077 A1 Jan. 23, 2020

Related U.S. Application Data

(60) Continuation of application No. 15/831,921, filed on Dec. 5, 2017, now Pat. No. 10,475,999, which is a
(Continued)

(51) Int. Cl.
*H01L 47/00* (2006.01)
*H01L 45/00* (2006.01)
*H01L 27/24* (2006.01)

(52) U.S. Cl.
CPC .......... *H01L 45/1253* (2013.01); *H01L 27/24* (2013.01); *H01L 27/2436* (2013.01);
(Continued)

(58) Field of Classification Search
None
See application file for complete search history.

(56) References Cited

U.S. PATENT DOCUMENTS 6,225,207 B1 * 5/2001 Parikh ............... H01L 21/76808
438/622
7,863,598 B2 1/2011 Sugita et al.
(Continued)

OTHER PUBLICATIONS

Non-Final Office Action dated Oct. 26, 2016 for U.S. Appl. No. 14/923,589.
(Continued)

*Primary Examiner* — Hung K Vu
(74) *Attorney, Agent, or Firm* — Eschweiler & Potashnik, LLC

(57) ABSTRACT

Some embodiments relate to an integrated circuit including one or more memory cells arranged over a semiconductor substrate between an upper metal interconnect layer and a lower metal interconnect layer. A memory cell includes a bottom electrode disposed over the lower metal interconnect layer, a data storage or dielectric layer disposed over the bottom electrode, and a top electrode disposed over the data storage or dielectric layer. An upper surface of the top electrode is in direct contact with the upper metal interconnect layer without a via or contact coupling the upper surface of the top electrode to the upper metal interconnect layer. Sidewall spacers are arranged along sidewalls of the top electrode, and have bottom surfaces that rest on an upper surface of the data storage or dielectric layer.

20 Claims, 14 Drawing Sheets

Related U.S. Application Data division of application No. 14/923,589, filed on Oct. 27, 2015, now Pat. No. 9,847,481.

(52) U.S. Cl.
CPC .............. *H01L 45/08* (2013.01); *H01L 45/12* (2013.01); *H01L 45/1233* (2013.01); *H01L 45/146* (2013.01); *H01L 45/16* (2013.01); *H01L 45/1675* (2013.01); *H01L 45/1683* (2013.01)

(56) References Cited

U.S. PATENT DOCUMENTS

| | | | |
|---|---|---|---|
| 9,431,604 | B2 | 8/2016 | Liao et al. |
| 9,847,481 | B2 * | 12/2017 | Chang .................... H01L 27/24 |
| 2004/0160818 | A1 | 8/2004 | Rinerson et al. |
| 2007/0235710 | A1 | 10/2007 | Matsuzaki et al. |
| 2009/0261433 | A1 * | 10/2009 | Kang .................... H01L 43/02 257/421 |
| 2009/0283736 | A1 | 11/2009 | Kanzawa et al. |
| 2010/0244248 | A1 | 9/2010 | Fukumizu |
| 2012/0068136 | A1 | 3/2012 | Park et al. |
| 2012/0117801 | A1 | 5/2012 | Kim |
| 2012/0280199 | A1 | 11/2012 | Takagi |
| 2013/0062587 | A1 | 3/2013 | Lee et al. |
| 2013/0075686 | A1 | 3/2013 | Kawasaki |
| 2014/0131654 | A1 * | 5/2014 | Tu .................... H01L 45/1253 257/4 |
| 2014/0166961 | A1 | 6/2014 | Liao et al. |
| 2014/0252295 | A1 * | 9/2014 | Liao .................... H01L 27/2463 257/2 |
| 2014/0264233 | A1 | 9/2014 | Tu et al. |
| 2015/0048298 | A1 | 2/2015 | Hsieh et al. |
| 2015/0295172 | A1 | 10/2015 | Sung et al. |
| 2016/0268336 | A1 * | 9/2016 | Shum .................... H01L 43/12 |

OTHER PUBLICATIONS

Final Office Action dated May 8, 2017 for U.S. Appl. No. 14/923,589.
Notice of Allowance dated Aug. 11, 2017 for U.S. Appl. No. 14/923,589.
Non-Final Office Action dated Jan. 4, 2019 for U.S. Appl. No. 15/831,921.
Notice of Allowance dated Jul. 3, 2019 for U.S. Appl. No. 15/831,921.

* cited by examiner

METAL LANDING ON TOP ELECTRODE OF RRAM

REFERENCE TO RELATED APPLICATION

This Application is a Continuation of U.S. application Ser. No. 15/831,921 filed on Dec. 5, 2017, which is a Divisional of U.S. application Ser. No. 14/923,589 filed on Oct. 27, 2015 (now U.S. Pat. No. 9,847,481 issued on Dec. 19, 2017). The contents of the above-referenced matters are hereby incorporated by reference in their entirety.

BACKGROUND

Many modern day electronic devices contain electronic memory. Electronic memory may be volatile memory or non-volatile memory. Non-volatile memory retains its stored data in the absence of power, whereas volatile memory loses its stored data when power is lost. Resistive random access memory (RRAM) is one promising candidate for next generation non-volatile memory due to its simple structure and its compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
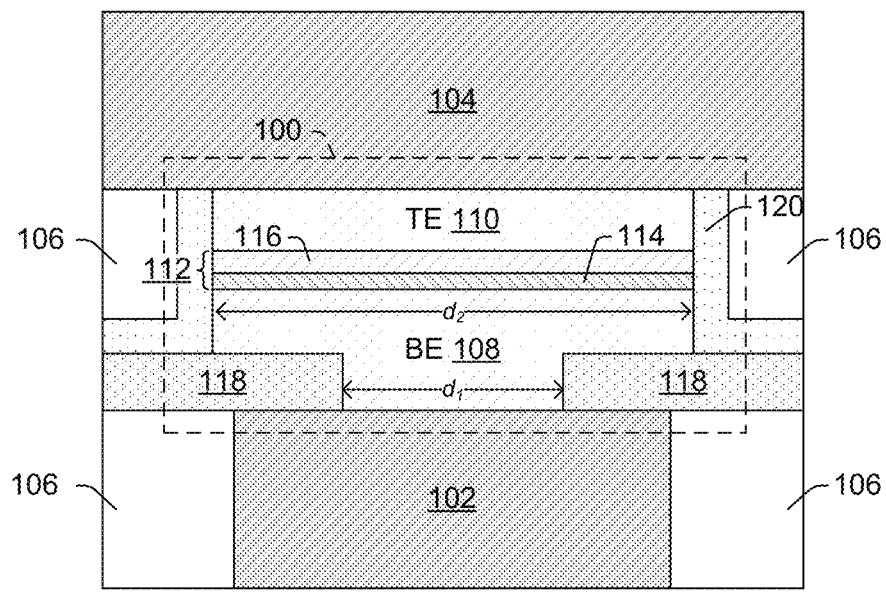
FIG. 1 illustrates a cross-sectional view of an RRAM cell in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random-access memory (RRAM) cell includes upper and lower electrodes, and a variable resistance element disposed between the upper and lower electrodes. The variable resistance element can be switched between different resistances that correspond to different data states, thereby enabling the RRAM cell to store one or more bit of data. In conventional RRAM cells, the upper electrode is coupled to an overlying metal layer (e.g., metal 1, metal 2, metal 3, etc.) by a contact or via. Although use of this coupling contact or via is widely adopted, the overall height of this RRAM cell plus this contact or via thereover is large relative to typical vertical spacing between adjacent metal layers (e.g., between a metal 2 layer and a metal 3 layer). To make this height more in line with the vertical spacing between adjacent metal layers, some embodiments of the present disclosure provides for techniques to couple the top electrode directly to an overlying metal line without a via or contact there between.

Referring to FIG. 1, a cross-sectional view of an RRAM cell 100 in accordance with some embodiments is provided. The RRAM cell 100 is disposed between a lower metal layer 102 and an upper metal layer 104, and is surrounded by dielectric material 106 such as an inter-metal dielectric (IMD) layer or inter-layer dielectric (ILD) layer. In some embodiments, the upper and lower metal layers 102, 104 are made of aluminum (Al), copper (Cu), tungsten (W), or combinations thereof, and the dielectric material 106 is a low-K or extreme low-K (ELK) dielectric material having a dielectric constant less than 3.9.

The RRAM cell 100 includes a bottom electrode 108 and a top electrode 110, which are separated from one another by a variable resistance element 112. In some embodiments, the bottom electrode 108 and/or top electrode 110 are made of platinum (Pt), aluminum copper (AlCu), titanium nitride (TiN), gold (Au), titanium (Ti), tantalum (Ta), tantalum nitride (TaN), tungsten (W), tungsten nitride (WN), or copper (Cu). In some embodiments, the bottom electrode 108 and top electrode 110 can be made of the same material as one another; while in other embodiments the bottom electrode 108 and top electrode 110 can be made of different materials from one another.

The variable resistance element 112 can include a resistance switching layer 114 and a capping layer 116, which are stacked between the bottom and top electrodes 108, 110. In some embodiments, the resistance switching layer 114 is made of nickel oxide (NiO), titanium oxide (TiO), hafnium oxide (HfO), zirconium oxide (ZrO), zinc oxide (ZnO), tungsten oxide ($WO_3$), aluminum oxide ($Al_2O_3$), tantalum oxide (TaO), molybdenum oxide (MoO), or copper oxide (CuO), for example. In some embodiments, the capping layer 116 can be made of platinum (Pt), aluminum copper (AlCu), titanium nitride (TiN), gold (Au), titanium (Ti), tantalum (Ta), tantalum nitride (TaN), tungsten (W), tungsten nitride (WN), or copper (Cu); and can be made of the same material or different material from the bottom electrode 108 and/or top electrode 110.

An etch-stop layer 118 is arranged over the lower metal layer 102, and a base portion of the bottom electrode 108 extends downward through an opening in the etch stop layer 118 to contact to lower metal layer 102. The base portion, which has lower sidewalls separated by a first distance d1, is narrower than an upper portion of the bottom electrode, which has upper sidewalls separated by a second distance, d2. A dielectric liner 120 is conformally disposed over sidewalls of top electrode 110, along sidewalls of capping layer 116, along sidewalls of resistance switching layer 114, and along upper sidewalls of bottom electrode 108. The dielectric liner 120 also extends laterally over the upper surface of etch-stop layer 118. In some embodiments, the dielectric liner 120 and etch stop layer 118 are made of silicon carbide (SiC), silicon dioxide ($SiO_2$), silicon oxynitride (SiON), or silicon nitride ($Si_3N_4$), and can be made of the same or different materials as one another.

Notably, the RRAM cell 100 has its top electrode 110 coupled directly to upper metal layer 104 without a via or contact there between. Top electrode 110 has an upper planar surface which extends continuously between sidewalls of the top electrode 110 and which directly abuts the upper metal layer 104, and which is co-planar with upper surfaces of dielectric liner 120. Thus, the top electrode 110 can have a rectangular cross-section in some embodiments. Compared to conventional RRAM cells which have a via or contact coupling the top electrode to the overlying metal line, the RRAM cell 100 exhibits a diminished height which is more in line with the vertical spacing between other adjacent metal layers. This can allow for more streamlined integration, which can reduce costs and/or improve device reliability in some embodiments.

During operation of the RRAM cell 100, the resistance switching layer 114 has a variable resistance that represents a unit of data, such as a bit of data (or multiple bits of data), and the capping layer 116 is thought to transfer oxygen ions corresponding to oxygen vacancies to and from filaments in the resistance switching layer 114 to change the resistance of the resistance switching layer 114. Whether ions are stripped from the filaments within the resistance switching layer 114 or stuffed into the filaments of the resistance switching layer 114 depends on what bias is applied across the bottom and top electrodes 108, 110. For example, to write a first data state to the RRAM cell 100 (e.g., to "set" a logical "1"), a first bias can be applied across the bottom and top electrodes 108, 110 to strip oxygen ions from filaments in the resistance switching layer 114 and move those ions to the capping layer 116, thereby putting the resistance switching layer 114 in a low-resistance state. In contrast, to write a second data state to the RRAM cell 100 (e.g., "reset" a logical "0"), a second, different bias can be applied across the bottom and top electrodes 108, 110 to stuff oxygen ions from the capping layer 116 back into the filaments in the resistance switching layer 114, thereby putting the resistance switching layer 114 in a high-resistance state. Further, through application of a third bias condition (different from the first and second bias conditions) across the bottom and top electrodes 108, 110, the resistance of the resistance switching layer 114 can be measured to determine the stored resistance (i.e., data state) in the RRAM cell 100.

Figure 2:
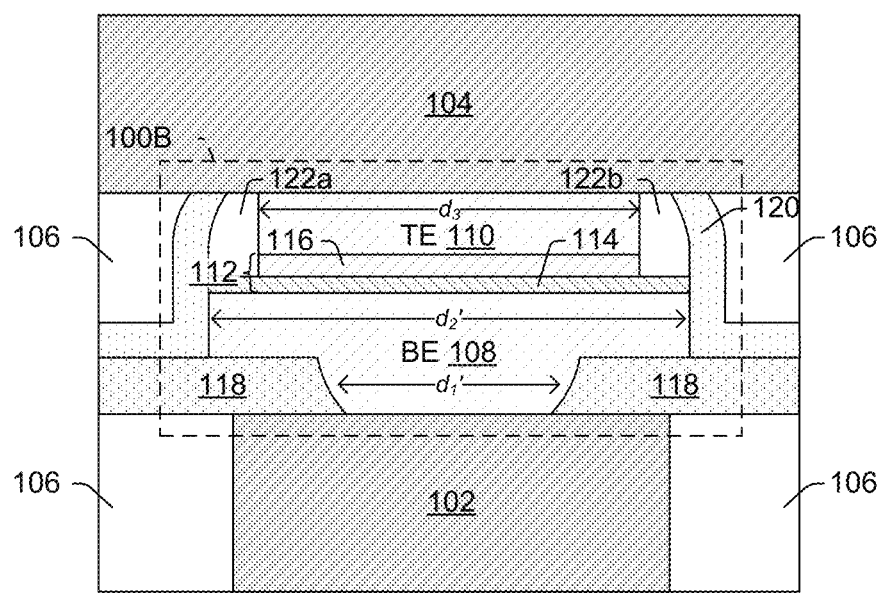
FIG. 2 illustrates a cross-sectional view of an RRAM cell in accordance with other embodiments.

FIG. 2 shows another embodiment of an RRAM cell 100B in accordance with other embodiments. Like FIG. 1's embodiment, the RRAM cell 100B includes a top electrode 110 having an upper surface that is in direct contact with upper metal layer 104. Also like FIG. 1's embodiment, FIG. 2's top electrode 110 has an upper planar surface which extends continuously between sidewalls of the top electrode and which directly abuts the upper metal layer 104. RRAM cell 100B also RRAM sidewall spacers 122a, 122b which abut outer sidewalls of top electrode 110 and capping layer 116. The RRAM sidewall spacers 122a, 122b sit on outer edges of upper surface of resistance switching layer 114, and can be made of a dielectric material, such as silicon nitride ($Si_3N_4$), a multilayer oxide-nitride-oxide film, or un-doped silicate glass (USG), for example. The RRAM sidewall spacers 122a, 122b can have tapered or rounded upper surfaces, and the dielectric liner 120 is disposed conformally over the structure to follow outer sidewalls of the RRAM sidewall spacers 122a, 122b, and extend downward along outer sidewalls of the resistance switching layer 114 and bottom electrode 108. Whereas FIG. 1's upper portion of bottom electrode 108 and top electrode 110 had equal widths $d_2$; FIG. 2's bottom electrode 108 has a width $d_2'$ that is larger than width $d_3$ of the top electrode 110.

Figure 3A:
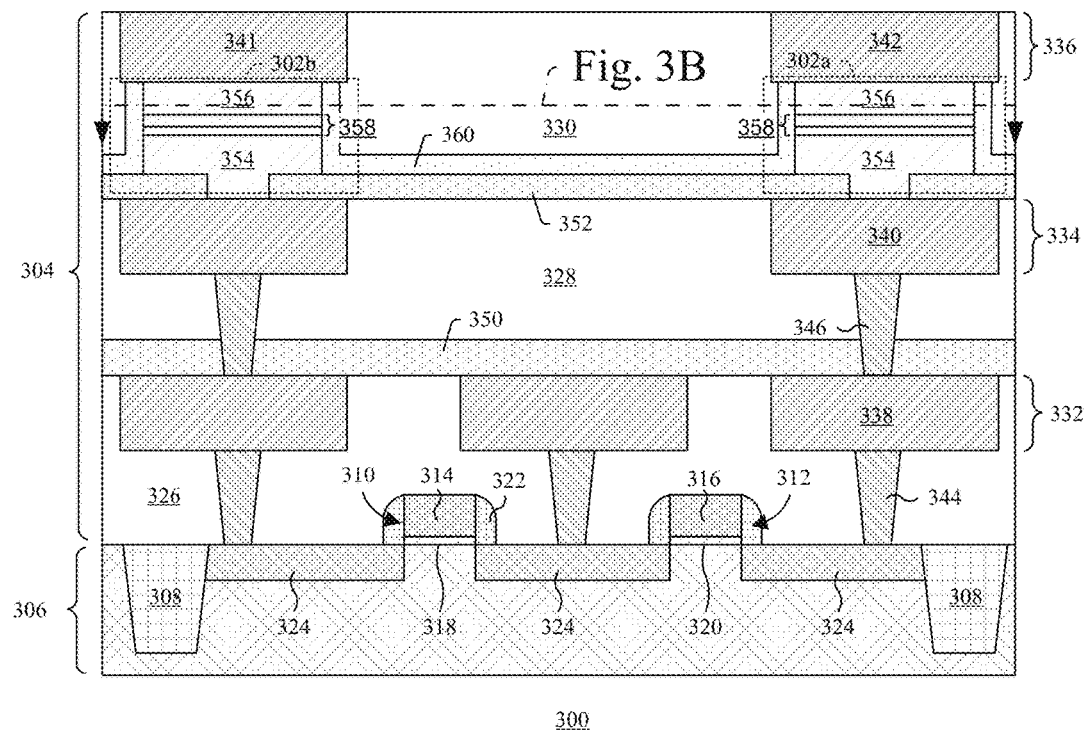
FIG. 3A illustrates a cross-sectional view of some embodiments of an integrated circuit including RRAM cells arranged in an interconnect structure.

FIG. 3A illustrates a cross sectional view of some embodiments of an integrated circuit 300, which includes RRAM cells 302a, 302b disposed in an interconnect structure 304 of the integrated circuit 300. The integrated circuit 300 includes a substrate 306, which may be, for example, a bulk substrate (e.g., a bulk silicon substrate) or a silicon-on-insulator (SOI) substrate, and is illustrated with one or more shallow trench isolation (STI) regions 308.

Two word line transistors 310, 312 are disposed between the STI regions 308. The word line transistors 310, 312 include word line gate electrodes 314, 316, respectively; word line gate dielectrics 318, 320, respectively; word line sidewall spacers 322; and source/drain regions 324. The source/drain regions 324 are disposed within the substrate 306 between the word line gate electrodes 314, 316 and the STI regions 308, and are doped to have a first conductivity type which is opposite a second conductivity type of a channel region under the gate dielectrics 318, 320, respectively. The word line gate electrodes 314, 316 may be, for example, doped polysilicon or a metal, such as aluminum, copper, or combinations thereof. The word line gate dielectrics 318, 320 may be, for example, an oxide, such as silicon dioxide, or a high-K dielectric material. The word line sidewall spacers 322 can be made of silicon nitride ($Si_3N_4$), for example.

The interconnect structure 304 is arranged over the substrate 306 and couples devices (e.g., transistors 310, 312) to one another. The interconnect structure 304 includes a plurality of IMD layers 326, 328, 330, and a plurality of metallization layers 332, 334, 336 which are layered over one another in alternating fashion. The IMD layers 326, 328, 330 may be made of an oxide, such as silicon dioxide, or a low-K dielectric or an extreme low-K dielectric. The metallization layers 332, 334, 336 include metal lines 338, 340, 341, 342, which are formed within trenches, and which may be made of a metal, such as copper, aluminum, or combinations thereof. Contacts 344 extend from the bottom metallization layer 332 to the source/drain regions 324 and/or gate electrodes 314, 316; and vias 346 extend between the metallization layers 332, 334. The contacts 344 and the vias 346 extend through dielectric-protection layers 350, 352, which can be made of dielectric material and can act as etch stop layers during manufacturing. The dielectric-protection layers 350, 352 may be made of an extreme low-K dielectric material, such as SiC, for example. The contacts 344 and the vias 346 may be made of a metal, such as copper, aluminum, tungsten, or combinations thereof, for example.

RRAM cells 302a, 302b, which are configured to store respective data states, are arranged within the interconnect structure 304 between neighboring metal layers. The RRAM cells 302a, 302b each include a bottom electrode 354 and a top electrode 356, which are made of conductive material. Between its top and bottom electrodes 354, 356, each RRAM cell 302a, 302b includes a variable resistance element 358, and a conformal dielectric layer 360 is disposed along sidewalls of the RRAM cells and over dielectric protection layer 352. The metal lines 341, 342 each have a lowermost surface that is co-planar with and in direct electrical contact with (e.g., ohmically coupled to) a top surface of top electrodes 356. These structures within RRAM cell 302a can correspond to those previously described with regards to FIG. 1 or FIG. 2, and in which the top electrode 356 is in direct contact with the upper metal layer 341, 342.

Although FIG. 3A shows the RRAM cells 302a, 302b arranged between the second and third metal layers 334, 336, it will be appreciated that RRAM cells can be arranged between any neighboring metal layers in the interconnect structure 304. Further, although FIG. 3 illustrates only three metal layers for purposes of illustration, any number of metal lines can be included in interconnect structure 304. Further still, the RRAMs cells need not be arranged between the two uppermost metallization layers as illustrated, but additional dielectric-protection layers and metallization layers can be included over the RRAM cells. Further, although this disclosure is described in the context of RRAM memory cells, it will be appreciated that these concepts can also be applied to other types of memory cells, such as ferromagnetic RAM (FeRAM) or phase-change RAM (PCRAM) for example, which are disposed between adjacent metallization layers, and can also be applied to metal-insulator-metal (MIM) capacitors. Accordingly, in these alternative embodiments, a resistance switching layer (e.g., 112 in FIG. 1 or 358 in FIG. 3) can more generally be referred to as a data storage layer or a dielectric layer in the context of memory devices or MIM capacitors.

Figure 3B:
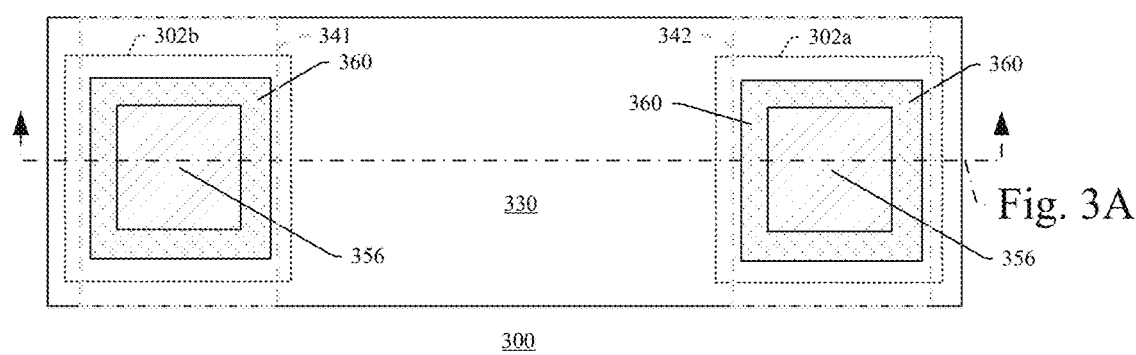
FIG. 3B illustrates a top view of some embodiments of an integrated circuit including RRAM cells in accordance with FIG. 3A.

FIG. 3B depicts some embodiments of a top view of FIG. 3A's integrated circuit 300 as indicated in the cut-away lines shown in FIGS. 3A-3B. As can be seen, the RRAM cells 302a, 302b can have a square or rectangular shape when viewed from above in some embodiments. In other embodiments, however, for example due to practicalities of many etch processes, the corners of the illustrated square shape can become rounded, resulting in RRAM cells 302a, 302b having a square or rectangular shape with rounded corners, or having a circular or oval shape when viewed from above. The MRAM cells 302a, 302b are arranged under metal lines 341, 342, respectively, and have top electrodes 356 in direct electrical connection with the metal lines 341, 342, respectively, without vias or contacts there between.

Figure 4:
FIG. 4 illustrates a flow chart depicting a method in accordance with some embodiments

FIG. 4 provides a flowchart of some embodiments of a method 400 for manufacturing an RRAM cell in accordance with some embodiments. While the disclosed method 400 and other methods that are illustrated and/or described herein may be illustrated and/or described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 401, a substrate which includes RRAM top and bottom electrodes is provided.

To form these RRAM top and bottom electrodes, a substrate is received at 402. An interconnect structure, which includes a plurality of metal layers and dielectric layers stacked over one another over, is disposed over the substrate.

At 404, an etch stop layer is formed over an upper surface of a metal layer and over an upper surface of a dielectric layer of the interconnect structure. A first mask is formed over the etch stop layer.

At 406, a first etch is performed with the first mask in place to form an opening in the etch stop layer.

At 408, a bottom electrode layer is formed to extend through the opening in the etch stop layer and make contact with the metal layer. A resistance switching layer is formed over the bottom electrode layer, a capping layer is formed over resistance switching layer, and a top electrode layer is formed over the capping layer. A second mask is then formed and patterned over the top electrode layer.

At 410, a second etch is performed with the second mask in place to pattern the top electrode and bottom electrode.

At 412, a conformal dielectric liner is formed over an upper surface and sidewalls of patterned top electrode. The conformal dielectric liner extends downward along sidewalls of the capping layer, resistance switching layer, and bottom electrode.

At 414, a bottom antireflective coating (BARC) layer and/or photoresist layer are formed over the conformal dielectric liner.

At 416, a third etch is performed to etch back the BARC and/or photoresist layer. This third etch removes a portion of the conformal dielectric liner to expose an upper surface of the patterned top electrode while leaving a remaining portion of the conformal dielectric liner, BARC, and photoresist layer in place to cover sidewalls of the top electrode and sidewalls of the bottom electrode.

At 418, a remainder of the BARC and photoresist layer is removed, for example by ashing, thereby exposing upper and sidewall surfaces of the conformal dielectric liner.

At 420, an interlayer dielectric (ILD) layer is formed over the exposed upper surface of the patterned top electrode and over the upper surfaces and sidewalls of the conformal dielectric liner.

At 422, via openings and trench openings are formed in the ILD layer.

At 424, the via openings and trench openings are filled with metal to form conductive metal lines and conductive vias, where a metal line is in direct contact with the patterned top electrode.

With reference to FIGS. 5-16, a series of cross-sectional views that collectively illustrate an example manufacturing flow consistent with some example of FIG. 4 is provided. Although FIGS. 5-16 are described in relation to the method 400, it will be appreciated that the structures disclosed in FIGS. 5-16 are not limited to the method, but instead may stand alone as structures independent of the method. Similarly, although the method is described in relation to FIGS. 5-16, it will be appreciated that the method is not limited to the structures disclosed in FIGS. 5-16, but instead may stand alone independent of the structures disclosed in FIGS. 5-16.

Figure 5:
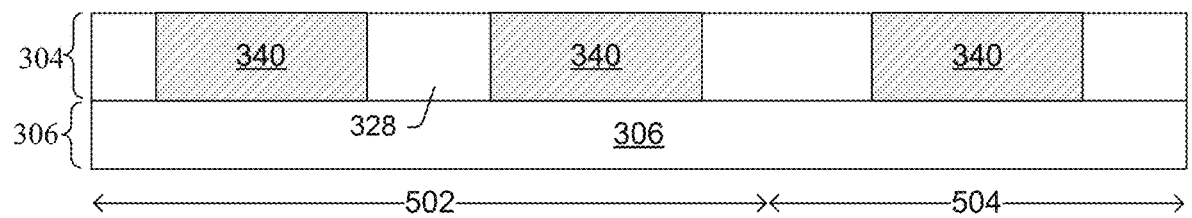
FIGS. 5 through 16 illustrate a series of incremental manufacturing steps as a series of cross-sectional views.

FIG. 5 illustrates a cross-sectional view of some embodiments corresponding to Act 402 of FIG. 4.

FIG. 5 illustrates a cross-sectional view of some embodiments illustrating an interconnect structure 304 disposed over a substrate 306. The illustrated portion of the substrate includes a memory region 502 and a logic region 504 surrounding the memory region 502. The interconnect structure 304 includes an IMD layer 328 and one or more metal lines 340 which extend horizontally through the IMD layer 328. Other IMD layers and metal lines can also be included in interconnect structure 304, but are omitted here for purposes of clarity. The IMD layer 328 can be an oxide, such as silicon dioxide, a low-κ dielectric material, or an extreme low-κ dielectric material. The metal line 340 can be made of a metal, such as aluminum, copper, or combinations thereof. In some embodiments, the substrate 306 can be a bulk silicon substrate or a semiconductor-on-insulator (SOI) substrate (e.g., silicon on insulator substrate). The substrate 306 can also be a binary semiconductor substrate (e.g., GaAs), a tertiary semiconductor substrate (e.g., AlGaAs), or a higher order semiconductor substrate, for example. In many instances, the substrate 306 manifests as a semiconductor wafer during the method 400, and can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example. After processing is completed, for example after upper metal layer is formed over RRAM cells, such a wafer can optionally be stacked with other wafers or die, and is then singulated into individual die which correspond to individual ICs.

Figure 6:
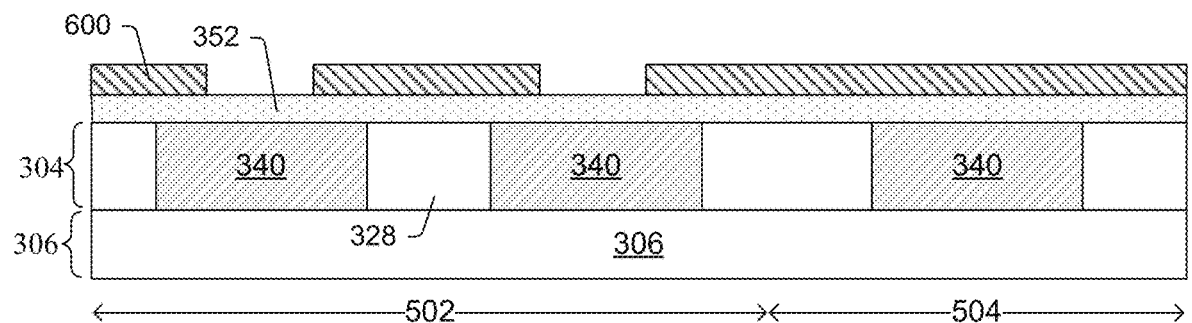

FIG. 6 illustrates a cross-sectional view of some embodiments corresponding to Act 404 of FIG. 4.

In FIG. 6, a dielectric-protection layer 352 is formed over IMD layer 328 and over metal line 340. The dielectric-protection layer 352 is made of dielectric material, such as an oxide or ELK dielectric, and acts as an etch-stop layer. In some embodiments, the dielectric-protection layer 352 comprises SiC having a thickness of approximately 200 Angstroms. A mask 600, such as a hard mask, antireflective coating (ARC) layer, and/or photoresist layer, is then patterned over the dielectric protection layer 352. Mask 600 can be formed, for example, by spinning a layer of photoresist onto the wafer, selectively exposing portions of the photoresist layer to light by shining light through a reticle, and developing the exposed photoresist.

Figure 7:
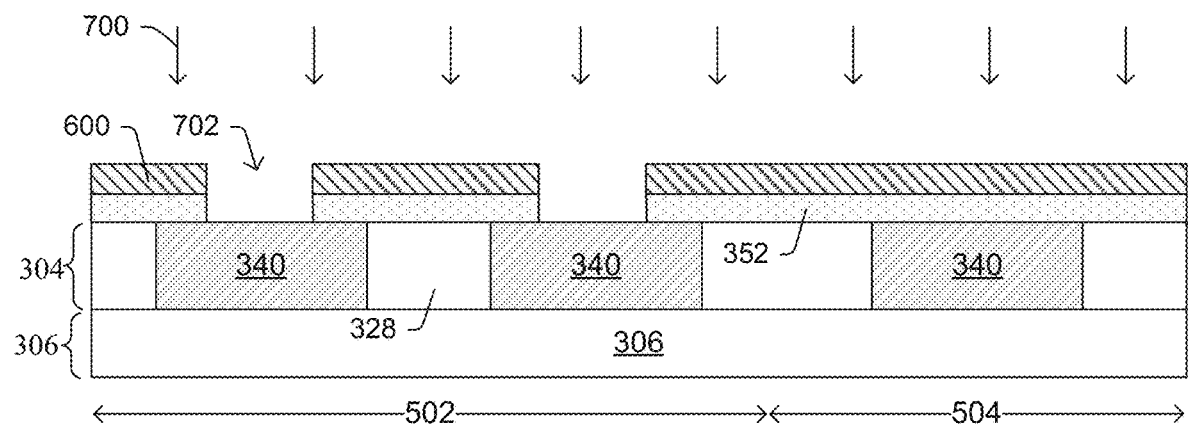

FIG. 7 illustrates a cross-sectional view of some embodiments corresponding to Act 406 of FIG. 4.

In FIG. 7, a first etch 700 is carried out with the mask 600 in place to selectively remove portions of the dielectric-protection layer 352. In FIG. 7's embodiment, the first etch 700 is an anisotropic etch, such as a dry or plasma etch, that forms openings 702 having vertical sidewalls in the dielectric-protection layer 352. In other embodiments, an isotropic etch, such as a wet etch, can be used and the openings 702 can have angled or tapered sidewalls that are non-vertical.

Figure 8:
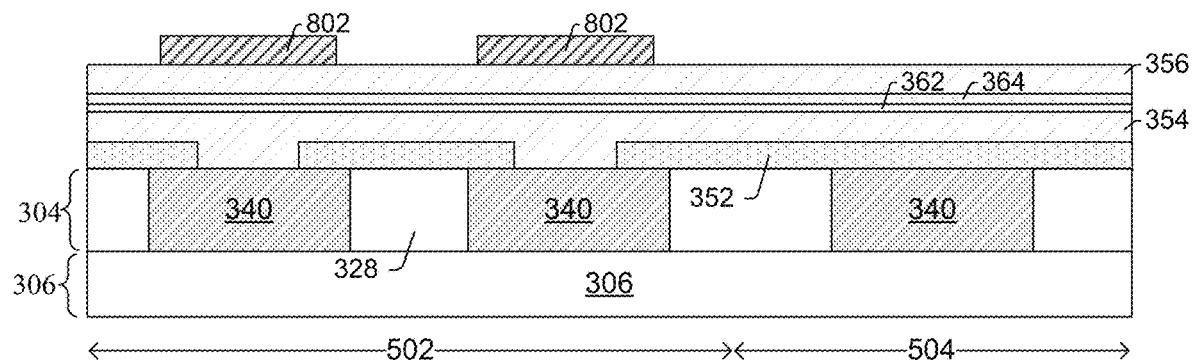

FIG. 8 illustrates a cross-sectional view of some embodiments corresponding to Act 408 of FIG. 4.

In FIG. 8, a bottom electrode layer 354 is formed over the dielectric-protection layer 352, and extends downwardly through the opening in the dielectric-protection layer 352 to make electrical contact with the metal line 340. A resistance switching layer 362 is then formed over an upper surface of the bottom electrode layer 354, and a capping layer 364 is then formed over an upper surface of the resistance switching layer 362. A top electrode layer 356 is formed over the capping layer 364. Further, the top electrode layer 356 may be, for example, about 10-100 nanometers thick. A second mask 802 is disposed over an upper surface of the top electrode layer 356. In some embodiments, the second mask 802 is a photoresist mask, but can also be a hard mask such as a nitride mark.

Figure 9:
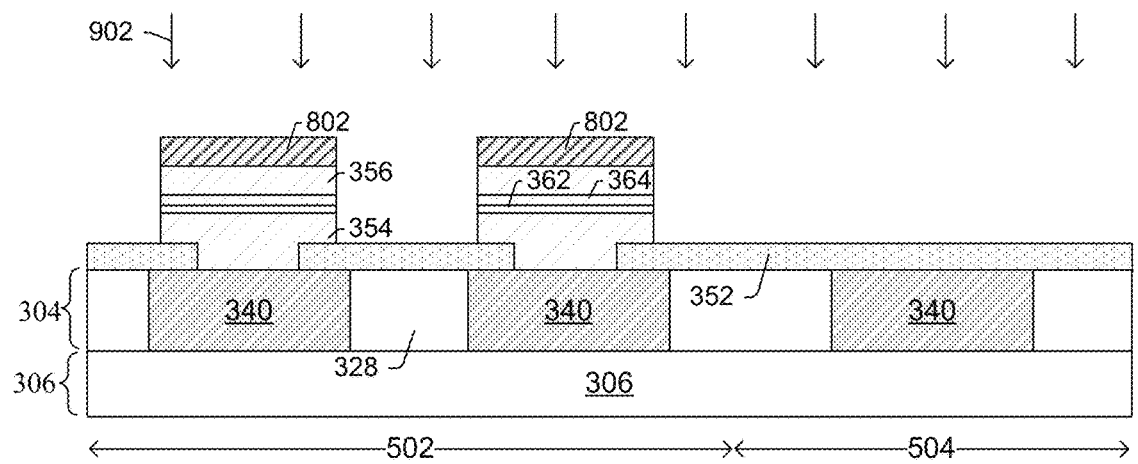

FIG. 9 illustrates a cross-sectional view of some embodiments corresponding to Act 410 of FIG. 4.

In FIG. 9, a second etch 902 is carried out with the second mask 802 in place to selectively remove portions of the top electrode 356, capping layer 364, resistance switching layer 362, and bottom electrode 354 until an upper surface of dielectric protection layer 352 is exposed. In some embodiments, this second etch 902 is an anisotropic etch, such as a unidirectional or vertical etch.

Figure 10:
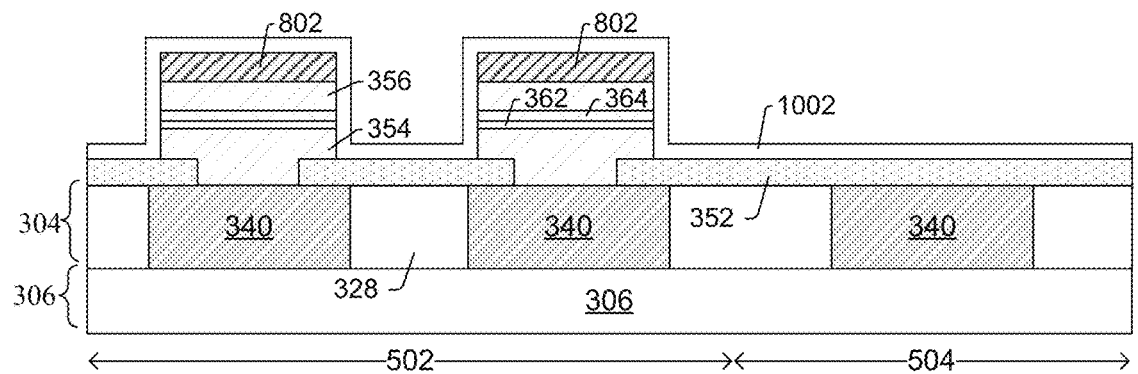

FIG. 10 illustrates a cross-sectional view of some embodiments corresponding to Act 412 of FIG. 4.

In FIG. 10, a conformal dielectric layer 1002 is formed over the structure, lining the upper surface and sidewalls of the second mask 802, sidewalls of the top electrode 356, sidewalls of the capping layer 364, sidewalls of the resistance switching layer 362, and upper sidewalls of the bottom electrode 354. The conformal dielectric layer 1002 may be formed of, for example, silicon nitride, silicon carbide, or a combination of one or more of the foregoing. The conformal dielectric layer 1002 may be formed with a thickness of, for example, about 500 Angstroms.

Figure 11:
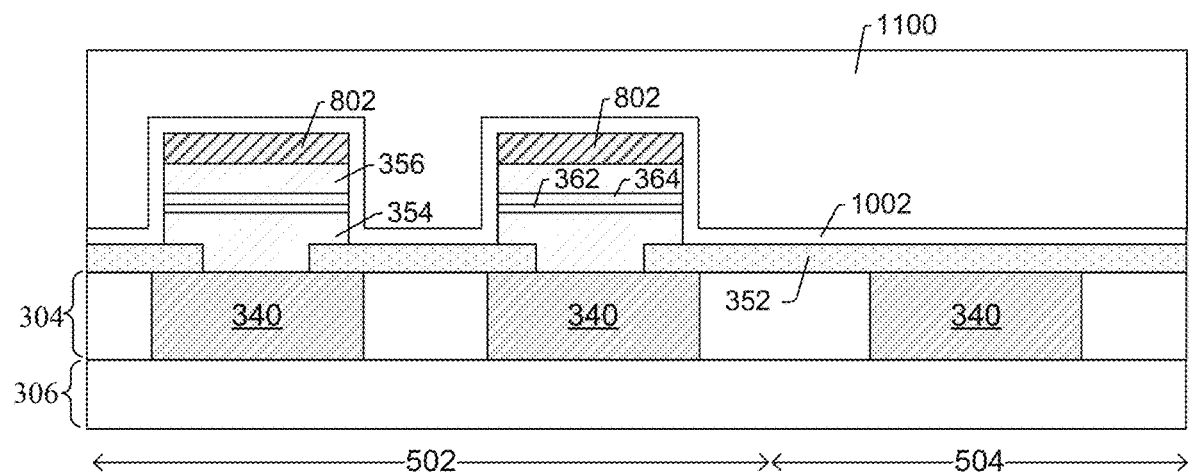

FIG. 11 illustrates a cross-sectional view of some embodiments corresponding to Act 414 of FIG. 4.

In FIG. 11, a protective layer 1100 is formed over the structure. In some embodiments, the protective layer 1100 is a BARC layer and/or a photoresist layer.

Figure 12:
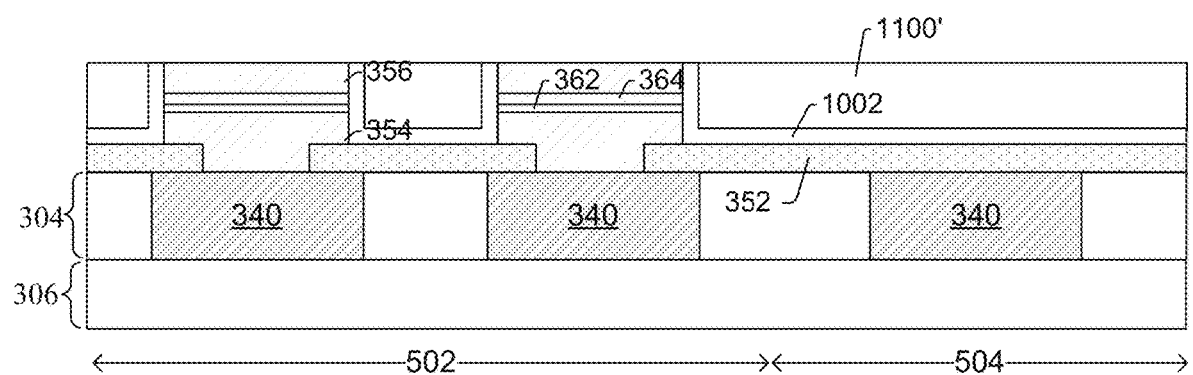

FIG. 12 illustrates a cross-sectional view of some embodiments corresponding to Act 416 of FIG. 4.

In FIG. 12, the protective layer 1100 has been etched back so as to remove the second mask layer 802 and portions of the conformal dielectric liner 1002, and thereby expose an upper surface of the top electrode 356. Remaining portions of the protective layer 1100' are left in place to cover sidewalls of the conformal dielectric layer 1002 and extend laterally over upper surface of conformal dielectric layer 1002.

Figure 13:
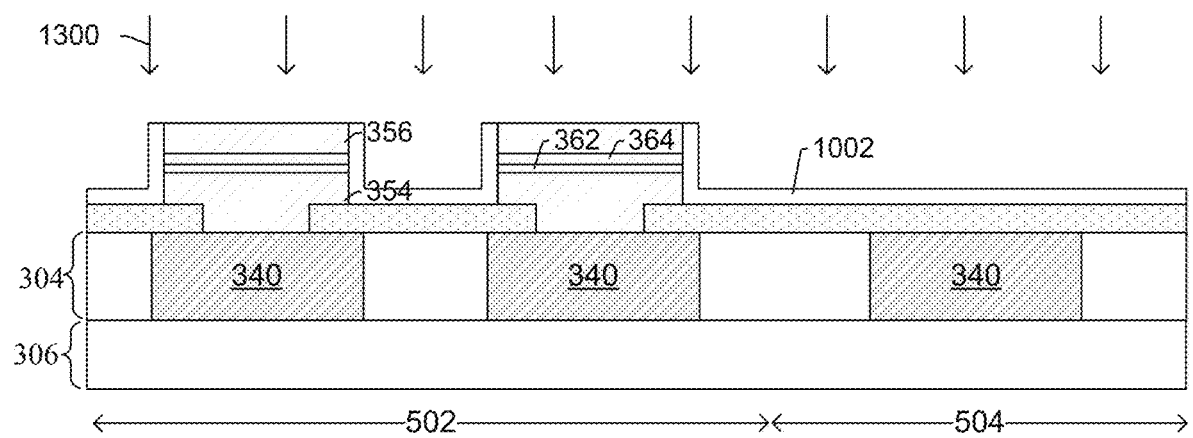

FIG. 13 illustrates a cross-sectional view of some embodiments corresponding to Act 418 of FIG. 4.

In FIG. 13, remaining portions of the protective layer 1100' have been removed. This removal may be accomplished, for example, by carrying out an ashing process 1300, such as a plasma ashing process.

Figure 14:
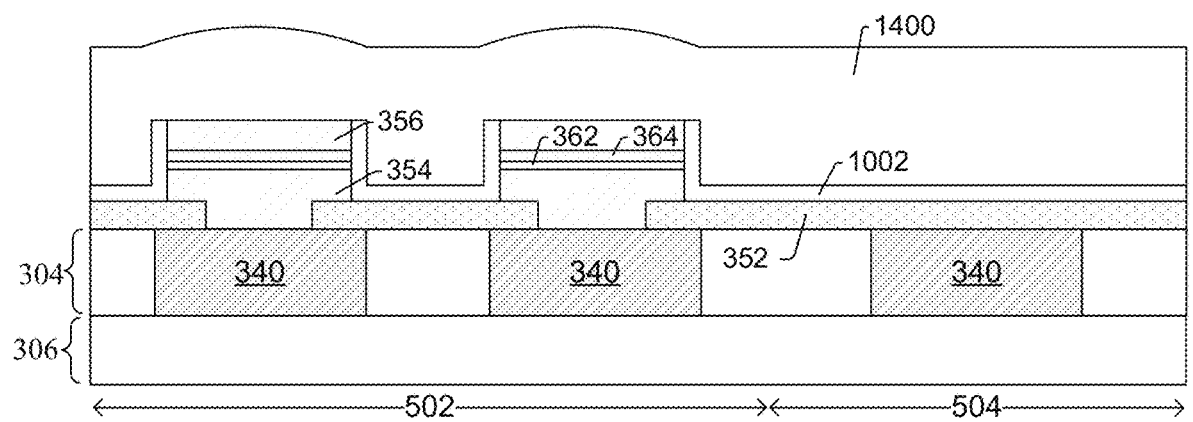

FIG. 14 illustrates a cross-sectional view of some embodiments corresponding to Act 420 of FIG. 4.

In FIG. 14, an IMD layer 1400, such as an extreme low-k dielectric layer is formed over the structure.

Figure 15:
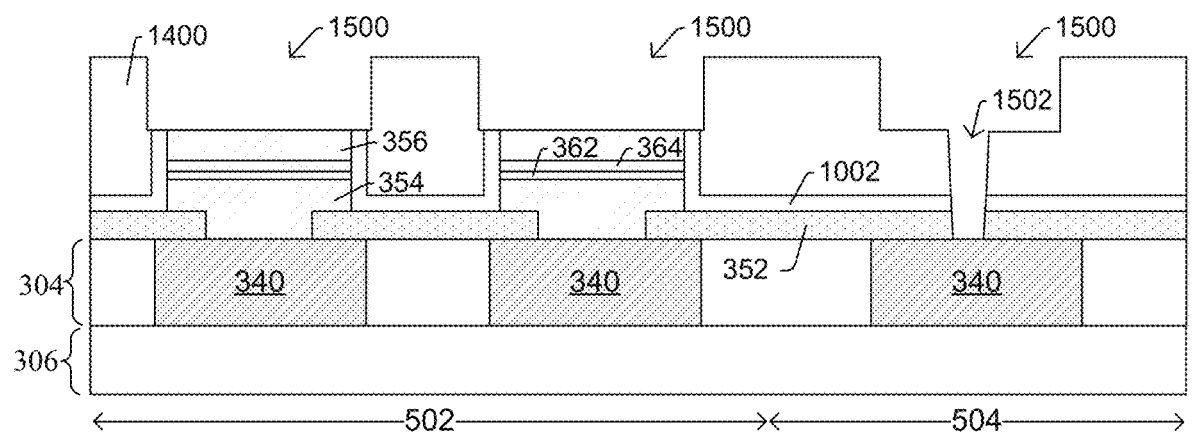

FIG. 15 illustrates a cross-sectional view of some embodiments corresponding to Act 422 of FIG. 4.

In FIG. 15, photolithography is carried out to pattern one or more masks (not shown), and one or more corresponding etches are carried out to form trench openings 1500 and via openings 1502. In some embodiments, these openings can be dual-damascene openings. In FIG. 15, the via opening 1502 is formed in the logic region and extends downward to an upper surface of lower metallization line 340.

Figure 16:
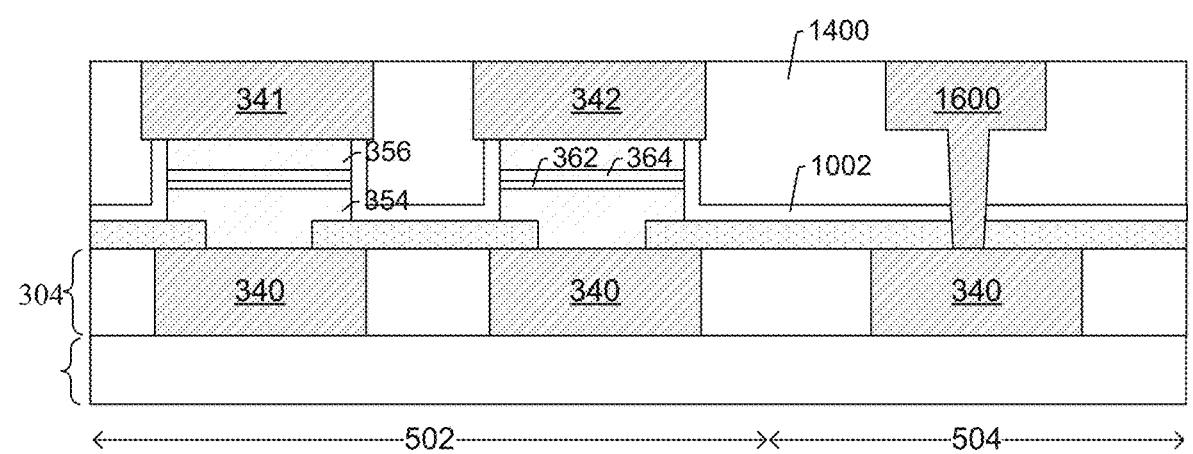

FIG. 16 illustrates a cross-sectional view of some embodiments corresponding to Act 424 of FIG. 4.

In FIG. 16, an upper metal layer 341, 342, 1600 is filled in the trench openings 1500 and via opening 1502. Thus, the upper metal layer 341, 342 can be in direct contact with the upper surface of the top electrodes 356 without a via connecting the top electrodes to the upper metal layer. For example, formation of the upper metal layer 341, 342, 1600 may include upper depositing a barrier layer in the via and trench openings, forming a Cu seed layer over the barrier layer in the via and trench openings, and then electroplating copper using the seed layer to fill the via and trench openings. Thus, the via openings and trench openings can be filled concurrently in some embodiments. After the upper metal layer is formed, chemical mechanical planarization (CMP) may be used to planarize upper surfaces of upper metal layer and IMD layer 1400.

Figure 17:
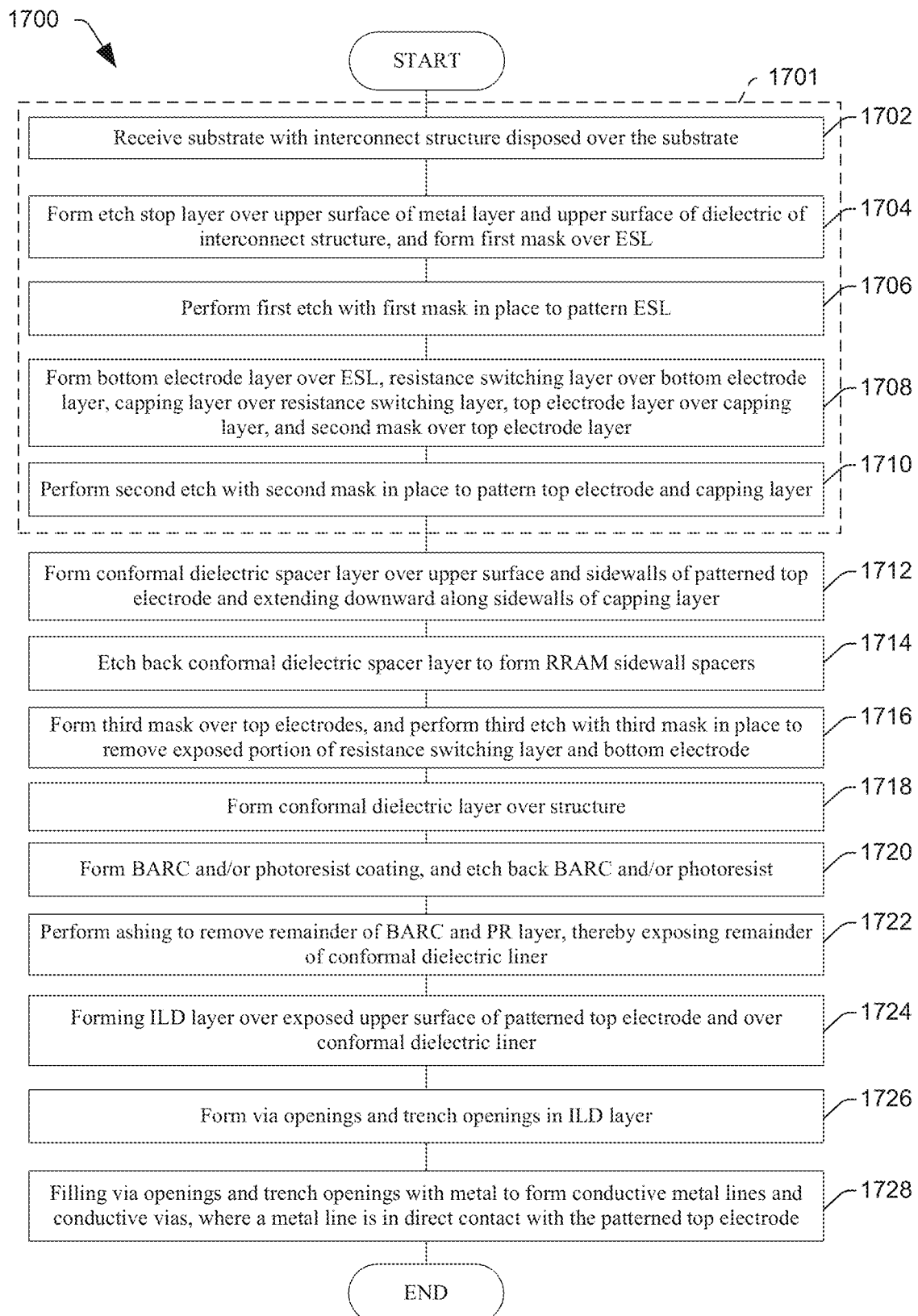
FIG. 17 illustrates a flow chart depicting a method in accordance with some embodiments

FIG. 17 provides a flowchart of some other embodiments of a method 1700 for manufacturing an RRAM cell in accordance with some embodiments.

At 1701, a substrate which includes RRAM top and bottom electrodes is provided. To from these structures, at 1702, substrate is received. The substrate includes an interconnect structure including a plurality of metal layers and dielectric layers stacked over one another over the substrate.

At 1704, an etch stop layer is formed over an upper surface of a metal layer and over an upper surface of a dielectric layer of the interconnect structure. A first mask is formed over the etch stop layer.

At 1706, a first etch is performed with the first mask in place to pattern the etch stop layer.

At 1708, a bottom electrode layer is formed over the etch stop layer, and a resistance switching layer is formed over the bottom electrode layer. A capping layer is formed over resistance switching layer, and a top electrode layer is formed over the capping layer. A second mask is formed and patterned over the top electrode layer.

At 1710, a second etch is performed with the second mask in place to pattern the top electrode and the capping layer.

At 1712, a conformal dielectric spacer layer is formed over an upper surface and sidewalls of the patterned top electrode. The conformal dielectric spacer extends downward along sidewalls of capping layer, and can also extend laterally over an upper surface of the resistance switching layer.

At 1714, the conformal dielectric spacer layer is etched back to form RRAM sidewall spacers, which are disposed about sidewalls of the patterned top electrode and capping layer.

At 1716, a third mask is formed over the top electrodes, and a third etch is performed with the third mask in place to remove an exposed portion of the resistance switching layer and the bottom electrode.

At 1718, a conformal dielectric layer is formed over the structure. The conformal dielectric layer extends over an upper surface and sidewalls of the patterned top electrode, sidewalls of the capping layer, sidewalls of the resistance switching layer, and sidewalls of the bottom electrode.

At 1720, a BARC and/or photoresist coating is formed over the structure, and the BARC and/or photoresist is then etched back to remove the conformal dielectric layer over the top electrode, thereby exposing an upper surface of the top electrode. Remaining portions of the BARC and/or photoresist coating still cover sidewalls of the conformal dielectric layer.

At 1722, the remaining portions of the BARC and/or photoresist layer are removed, thereby exposing sidewalls of the conformal dielectric liner.

At 1724, an ILD layer is formed over the exposed upper surface of patterned top electrode and over the conformal dielectric liner. In some embodiments, the ILD layer is made of an ELK dielectric material.

At 1726, via openings and trench openings are formed in the ILD layer.

At 1728, the via openings and trench openings are filled with metal to form conductive metal lines and conductive vias, where a metal line is in direct contact with the patterned top electrode.

With reference to FIGS. 18-34, a series of cross-sectional views that collectively illustrate an example manufacturing flow consistent with some example of FIG. 17 is provided.

Figure 18:
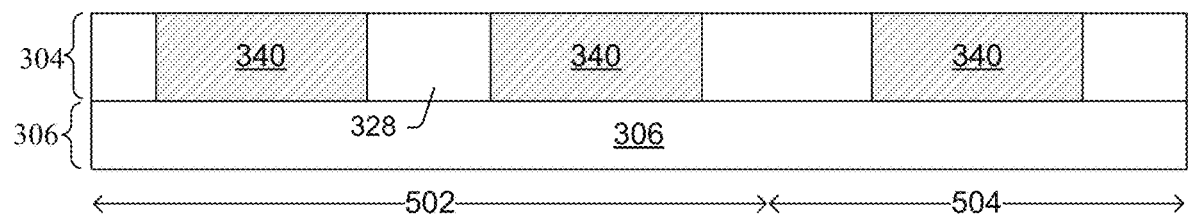
FIGS. 18 through 34 illustrate a series of incremental manufacturing steps as a series of cross-sectional views.

FIG. 18 illustrates a cross-sectional view of some embodiments corresponding to Act 1702 of FIG. 17.

FIG. 18 illustrates a cross-sectional view of some embodiments illustrating an interconnect structure 304 disposed over a substrate 306. FIG. 5 illustrates a cross-sectional view of some embodiments illustrating an interconnect structure 304 disposed over a substrate 306, and can be the same as previously described with respect to FIG. 5. The illustrated portion of the substrate includes a memory region 502 and a logic region 504 surrounding the memory region 502. The interconnect structure 304 includes an IMD layer 328 and one or more metal lines 340 which extend horizontally through the IMD layer 328.

Figure 19:
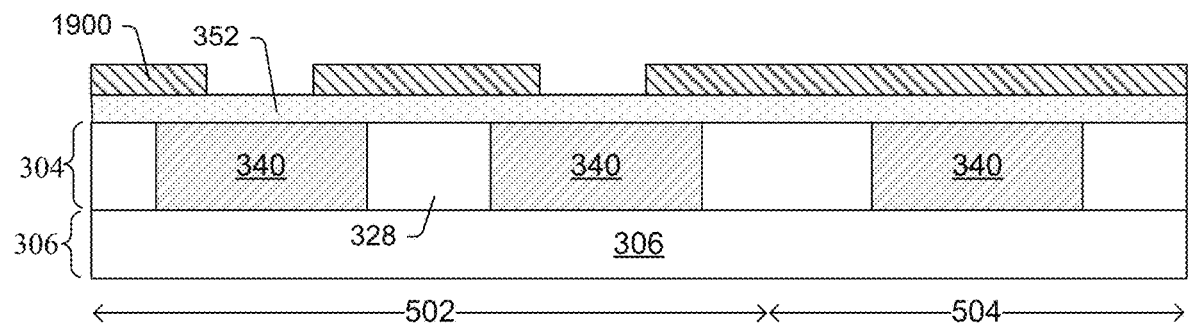

FIG. 19 illustrates a cross-sectional view of some embodiments corresponding to Act 1704 of FIG. 17.

In FIG. 19, a dielectric-protection layer 352 is formed over IMD layer 328 and over metal line 338. The dielectric-protection layer 352 is made of dielectric material, such as an oxide or ELK dielectric, and acts as an etch-stop layer. In some embodiments, the dielectric-protection layer 352 comprises SiC having a thickness of approximately 200 Angstroms. A mask 1900, such as a hard mask, antireflective coating (ARC) layer, and/or photoresist layer, is then patterned over the dielectric protection layer 352.

Figure 20:
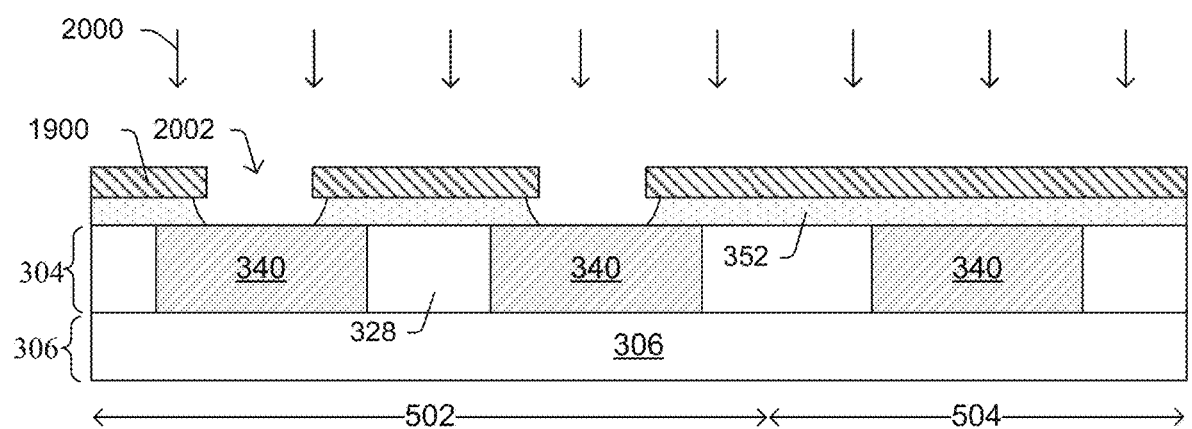

FIG. 20 illustrates a cross-sectional view of some embodiments corresponding to Act 1706 of FIG. 17.

In FIG. 20, a first etch 2000 is carried out with the mask 1900 in place to selectively remove portions of the dielectric-protection layer 352. In FIG. 20's embodiment, the first etch is an isotropic etch, such as a wet etch, that forms openings 2002 having rounded or tapered sidewalls in the dielectric-protection layer 352. In other embodiments, an anisotropic etch, such as a dry etch or plasma etch, can be used and may form the openings with vertical sidewalls.

Figure 21:
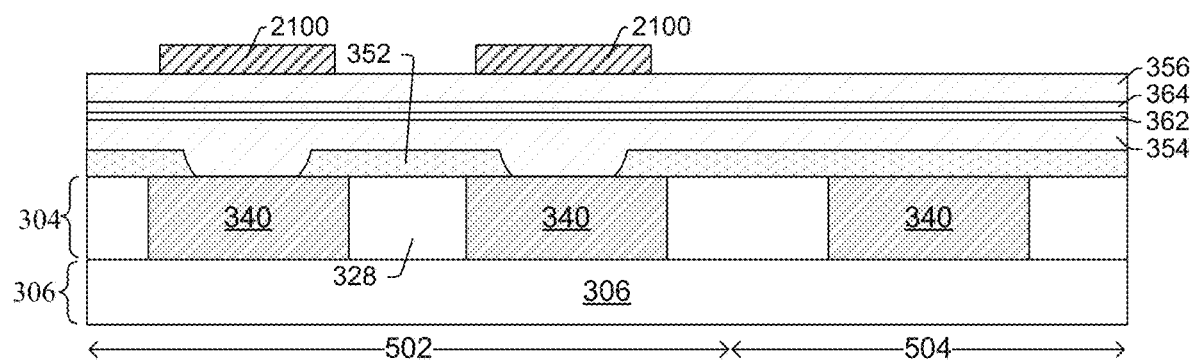

FIG. 21 illustrates a cross-sectional view of some embodiments corresponding to Act 1708 of FIG. 4.

In FIG. 21, a bottom electrode layer 354 is formed over the dielectric-protection layer 352, and extends downwardly through the opening in the dielectric-protection layer 352 to make electrical contact with the metal line 340. A resistance switching layer 362 is then formed over an upper surface of the bottom electrode layer 354, and a capping layer 364 is then formed over an upper surface of the resistance switching layer 362. A top electrode layer 356 is formed over the capping layer 364. Further, the top electrode layer 356 may be, for example, about 10-100 nanometers thick. A second mask 2100 is disposed over an upper surface of the top electrode layer 356. In some embodiments, the second mask 2100 is a photoresist mask, but can also be a hard mask such as a nitride mark.

Figure 22:
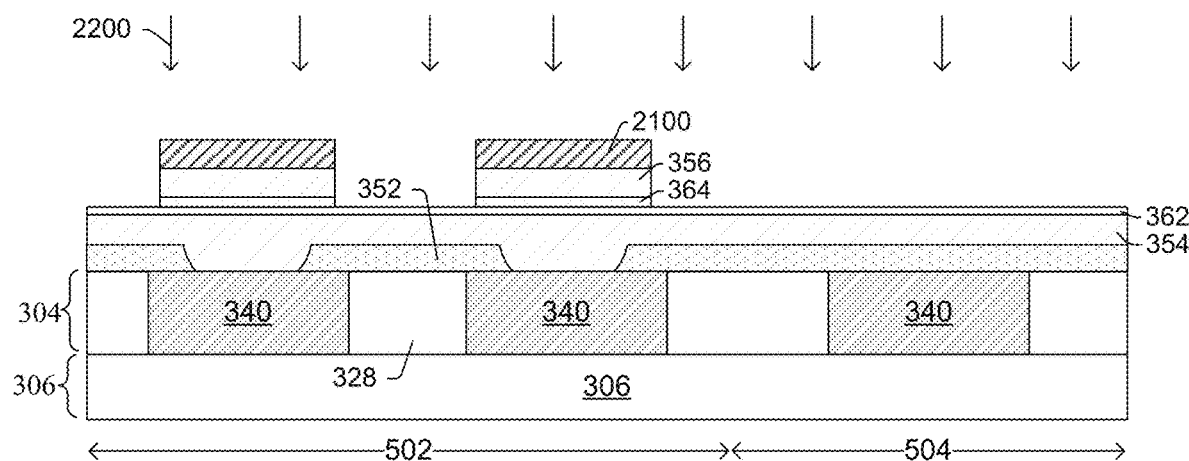

FIG. 22 illustrates a cross-sectional view of some embodiments corresponding to Act 1710 of FIG. 4.

In FIG. 22, a second etch 2200 is carried out with the second mask 2100 in place to selectively remove portions of the top electrode 356 and capping layer 364 until an upper surface of resistance switching layer is exposed. In some embodiments, the second etch is an anisotropic etch, such as a unidirectional or vertical etch. The second mask 2100 can optionally be removed after the second etch 2200.

Figure 23:
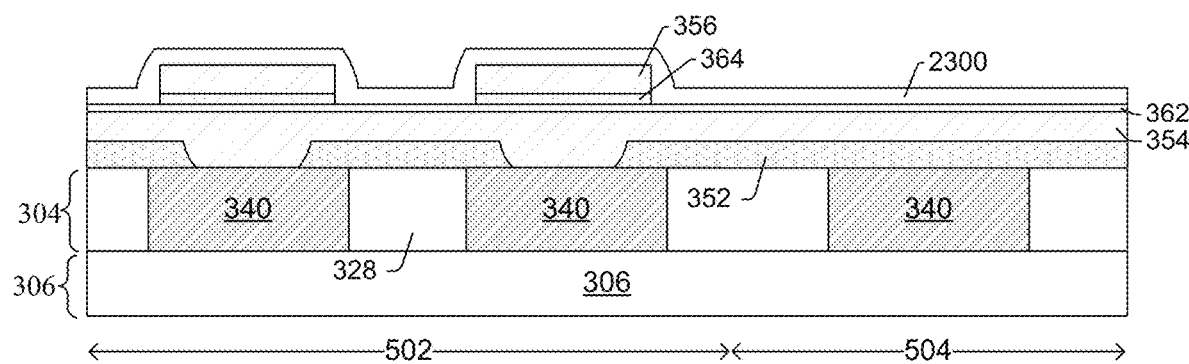

FIG. 23 illustrates a cross-sectional view of some embodiments corresponding to Act 1712 of FIG. 17.

In FIG. 23, a conformal dielectric spacer layer 2300 is formed over the structure, lining the upper surface and sidewalls of the top electrode 356, along sidewalls of the capping layer 364, and extending over an upper surface of resistance switching layer 362. The conformal dielectric spacer layer 2300 may be formed of, for example, silicon nitride, silicon carbide, or a combination of one or more of the foregoing. Even more, the conformal dielectric spacer layer may be formed with a thickness of, for example, about 500 Angstroms.

Figure 24:
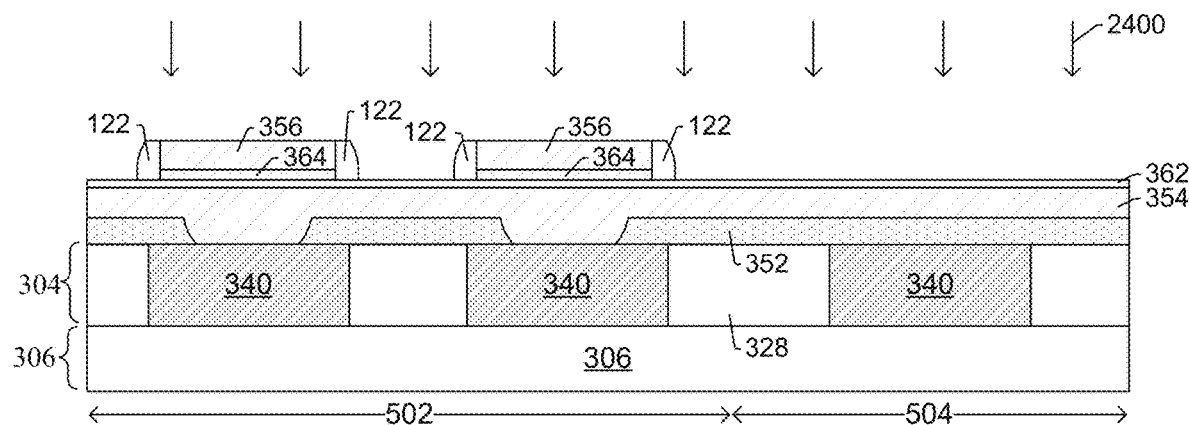

FIG. 24 illustrates a cross-sectional view of some embodiments corresponding to Act 1714 of FIG. 17.

In FIG. 24, an etch back process 2400 is used to etch back the conformal dielectric spacer layer 2300 to form RRAM sidewall spacers 122.

Figure 25:
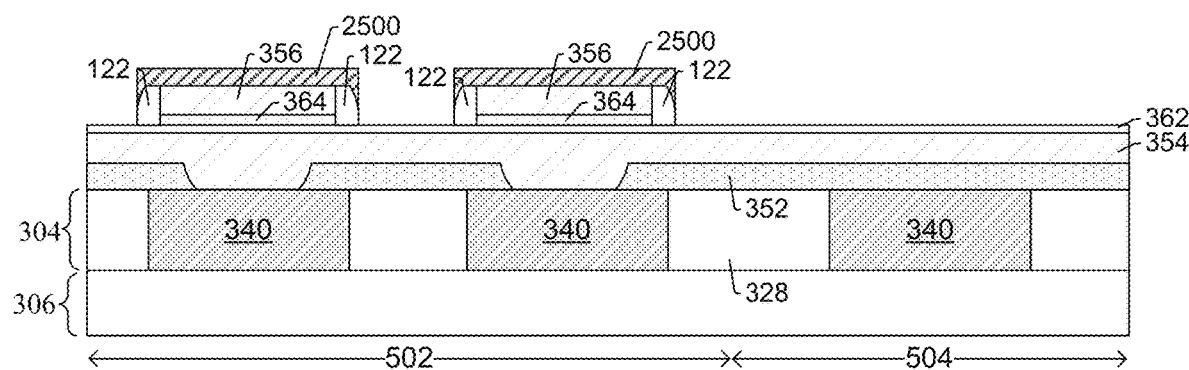

FIG. 25 illustrates a cross-sectional view of some embodiments corresponding to Act 1716 of FIG. 17.

In FIG. 25, a third mask 2500 is formed over the top electrode 356. The third mask can be a hard mask or a photomask, for example. Third Mask 2500 can be formed, for example, by spinning a layer of photoresist onto the wafer, selectively exposing portions of the photoresist layer to light by shining light through a reticle, and developing the exposed photoresist.

Figure 26:
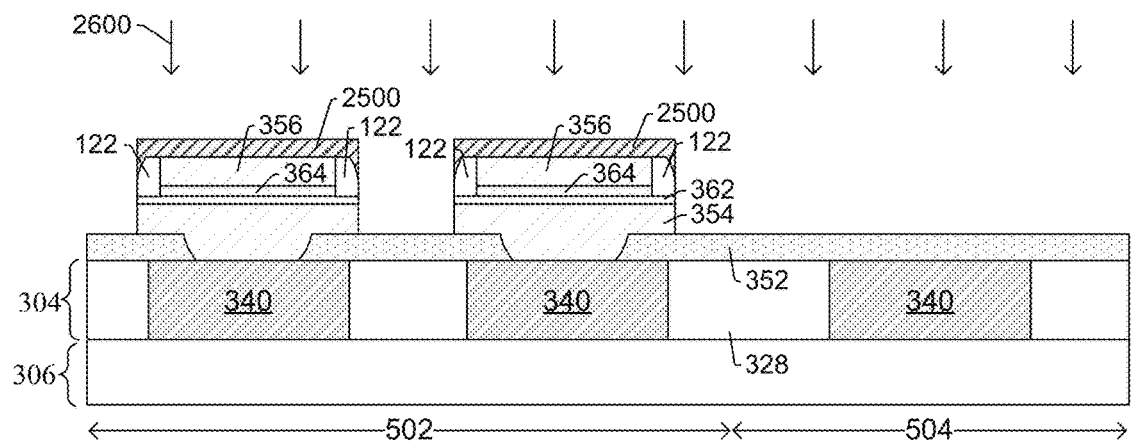

FIG. 26 illustrates a cross-sectional view of some embodiments corresponding to Act 1716 of FIG. 17.

Figure 27:
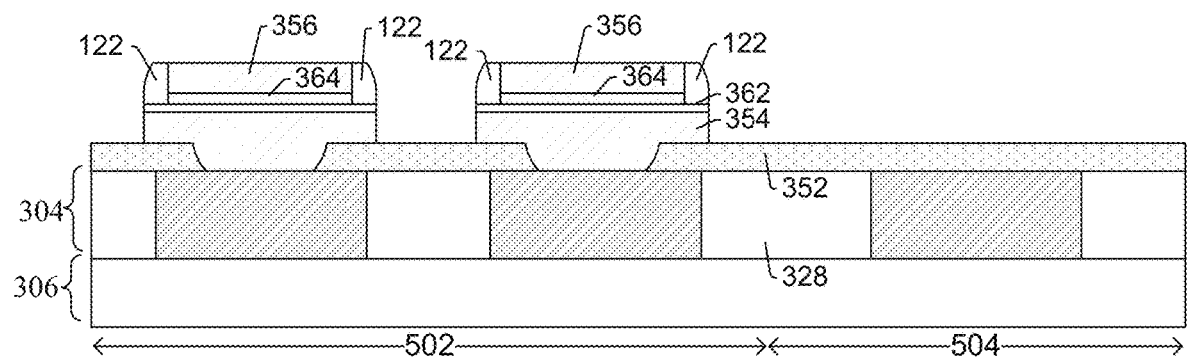

In FIG. 26, a third etch 2600 is carried out with the third mask 2500 in place to remove exposed portions of the resistance switching layer 362 and bottom electrode 354. In FIG. 27 the third mask 2500 has been removed, for example through a plasma etching process.

Figure 28:
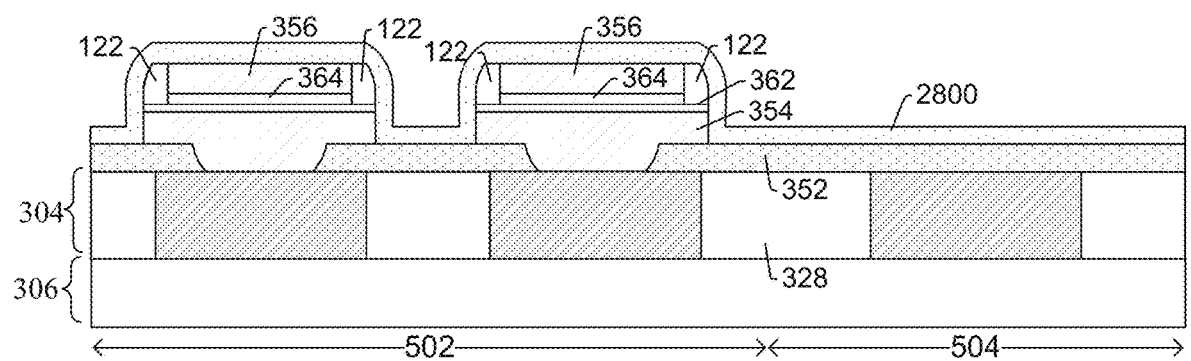

FIG. 28 illustrates a cross-sectional view of some embodiments corresponding to Act 1718 of FIG. 17.

In FIG. 28, a conformal dielectric layer 2800 is formed over the structure. The conformal dielectric layer 2800 may be formed of, for example, silicon nitride, silicon carbide, or a combination of one or more of the foregoing. The conformal dielectric layer 2800 may be formed with a thickness of, for example, about 500 Angstroms.

Figure 29:
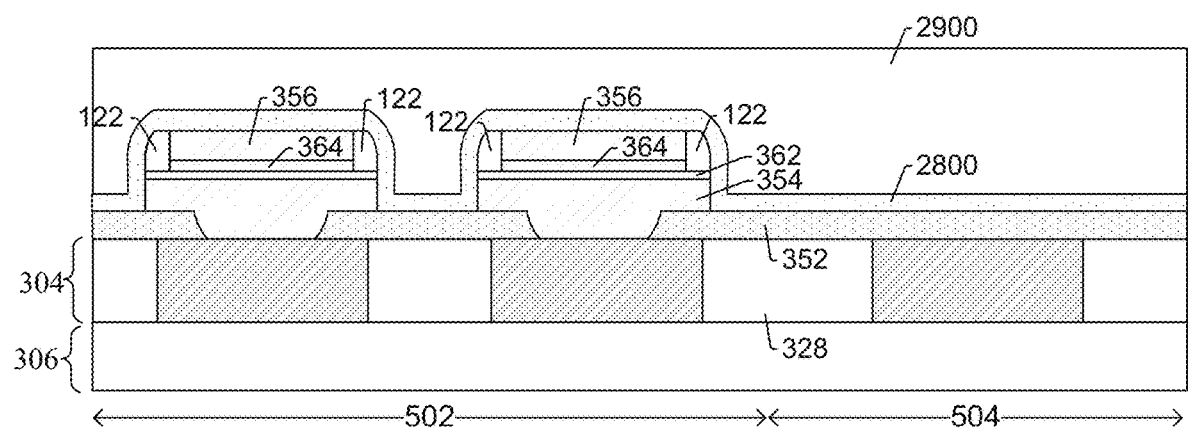

FIG. 29 illustrates a cross-sectional view of some embodiments corresponding to Act 1720 of FIG. 17.

In FIG. 29, a BARC layer 2900 and/or photoresist coating are formed over the structure.

Figure 30:
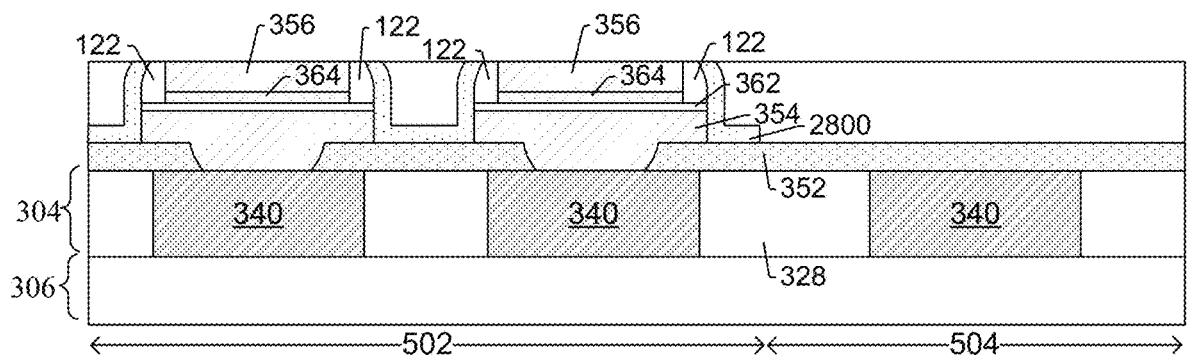

FIG. 30 illustrates a cross-sectional view of some embodiments corresponding to Act 1720 of FIG. 17.

In FIG. 30, the BARC layer 2900 and/or photoresist coating is etched back. This etch back removes a portion of the conformal dielectric layer 2800 from over the upper surface of top electrode 356, and leaves remaining portions of conformal dielectric layer 2800 along sidewalls of the RRAM sidewall spacers 122, and along sidewalls of bottom electrode 354. In FIG. 30, another mask and etch (not shown) have been used to remove the conformal dielectric layer 2800 from over the logic region 504.

Figure 31:
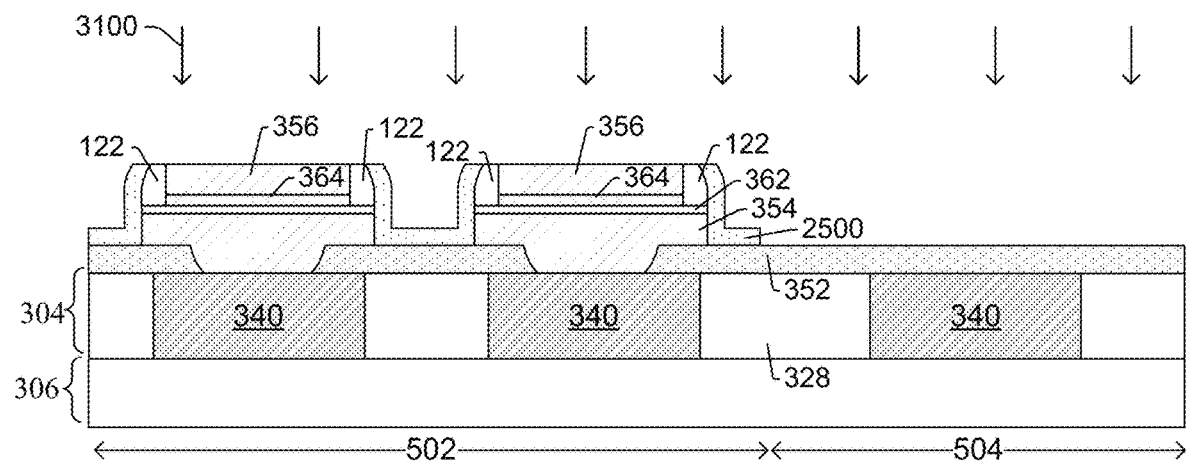

FIG. 31 illustrates a cross-sectional view of some embodiments corresponding to Act 1722 of FIG. 17.

In FIG. 31, an in-situ ashing process 3100 is carried out to remove the remaining portions of the conformal dielectric layer 2800.

Figure 32:
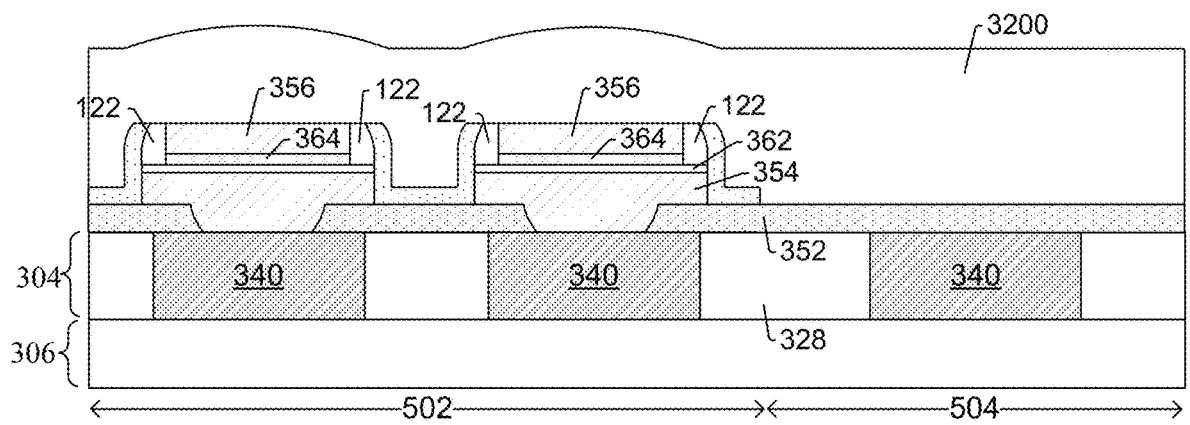

FIG. 32 illustrates a cross-sectional view of some embodiments corresponding to Act 1724 of FIG. 17.

In FIG. 32, an IMD layer 3200, such as an extreme low-k dielectric layer is formed over the structure.

Figure 33:
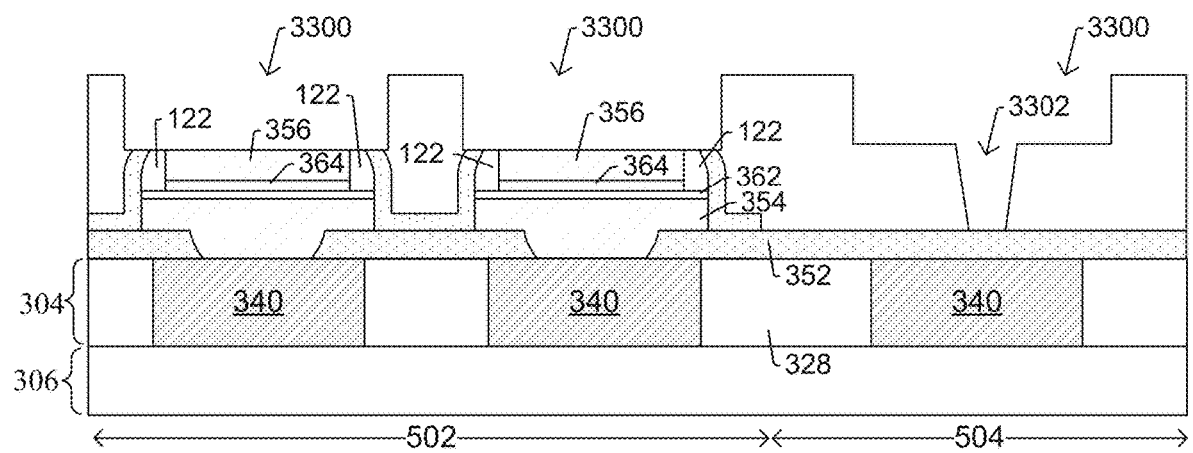

FIG. 33 illustrates a cross-sectional view of some embodiments corresponding to Act 1726 of FIG. 17.

In FIG. 33, photolithography is carried out to pattern one or more masks (not shown), and one or more corresponding etches are carried out to form trench openings 3300 and via openings 3302. In some embodiments, these openings can be dual-damascene openings. In FIG. 33, the via opening 3302 is formed in the logic region and extends downward to an upper surface of lower metallization line 340.

Figure 34:
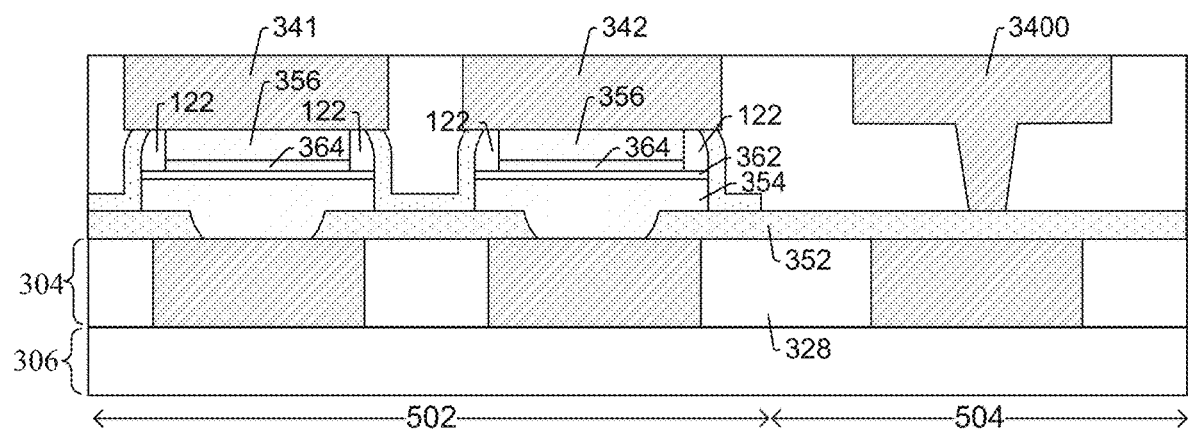

FIG. 34 illustrates a cross-sectional view of some embodiments corresponding to Act 1728 of FIG. 17.

In FIG. 34, an upper metal layer 341, 342, 3400 is filled in the trench openings 3300 and via opening 3302. Thus, the upper metal layer 341, 342 can be in direct contact with the upper surface of the top electrodes 356 without a via connecting the top electrodes to the upper metal layer. For example, formation of the upper metal layer 341, 342, 3400 may include upper depositing a barrier layer in the via and trench openings, forming a Cu seed layer over the barrier layer in the via and trench openings, and then electroplating copper using the seed layer to fill the via and trench openings. After the upper metal layer is formed, chemical mechanical planarization (CMP) may be used to planarize upper surfaces of upper metal layer and IMD layer 3200.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

Some embodiments relate to an integrated circuit including one or more memory cells arranged between an upper metal interconnect layer and a lower metal interconnect layer. A memory cell includes a bottom electrode coupled to the lower metal interconnect layer, a data storage layer disposed over the bottom electrode, and a capping layer disposed over the resistance switching layer. A top electrode is disposed over the capping layer. An upper surface of the top electrode is in direct contact with the upper metal interconnect layer without a via or contact coupling the upper surface of the top electrode to the upper metal interconnect layer.

Other embodiments relate to an integrated circuit (IC). The IC includes a semiconductor substrate including a memory region and a logic region. An interconnect structure is disposed over the memory region and the logic region. The interconnect structure includes a plurality of metal interconnect layers disposed over one another and isolated from one another by interlayer dielectric (ILD) material. A plurality of memory cells or MIM capacitors are arranged over the memory region and are arranged between a lower metal interconnect layer and an upper metal interconnect layer adjacent to the lower metal interconnect layer. A memory cell or MIM capacitor includes a bottom electrode coupled to an upper portion of the lower metal interconnect layer. The memory cell or MIM capacitor also includes a top electrode having an upper planar surface which extends continuously between sidewalls of the top electrode and which directly abuts a bottom surface of the upper metal interconnect layer.

Still other embodiments relate to a method. In the method, a semiconductor substrate is received which has an interconnect structure disposed over the substrate. A bottom electrode and a top electrode are formed over the interconnect structure over the memory region. The bottom electrode is coupled to a lower metal layer in the interconnect structure. The bottom and top electrodes are separated from one another by a data storage or dielectric layer. An interlayer dielectric (ILD) layer is formed over the top electrode. A trench opening having vertical or substantially vertical sidewalls is formed in the ILD layer. The trench opening exposes an upper surface of the top electrode. An upper metal layer is formed in the trench opening. The upper metal layer is in direct contact with the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) including one or more memory cells arranged over a semiconductor substrate and arranged between an upper metal interconnect layer and a lower metal interconnect layer, a memory cell comprising:
    a bottom electrode disposed over the lower metal interconnect layer;
    a non-magnetic data storage or dielectric layer disposed over the bottom electrode, the non-magnetic data storage or dielectric layer directly contacting the bottom electrode;
    a top electrode disposed over the non-magnetic data storage or dielectric-layer, wherein an upper surface of the top electrode is in direct contact with the upper metal interconnect layer without a via or contact coupling the upper surface of the top electrode to the upper metal interconnect layer; and
    sidewall spacers arranged along sidewalls of the top electrode, having bottom surfaces that rest on an upper surface of the non-magnetic data storage or dielectric layer, and having top surfaces that directly contact the upper metal interconnect layer.

2. The IC of claim 1, further comprising: a conformal dielectric along outer sidewalls of the sidewall spacers and extending downward along outer sidewalls of the non-magnetic data storage or dielectric layer.

3. The IC of claim 1, wherein the top electrode has an upper planar surface which extends continuously between the sidewalls of the top electrode and which directly abuts a corresponding co-planar surface of the upper metal interconnect layer.

4. The IC of claim 1, wherein the upper metal interconnect layer is made of aluminum, copper, or an aluminum copper alloy.

5. The IC of claim 1, the one or more memory cells further comprising:
    a non-magnetic capping layer disposed between the top electrode and the non-magnetic data storage or dielectric layer.

6. The IC of claim 5:
    wherein the top electrode and the bottom electrode are made of platinum, aluminum copper, titanium nitride, gold, titanium, tantalum, tantalum nitride, tungsten, tungsten nitride, or copper.

7. The IC of claim 1, wherein the semiconductor substrate includes a logic region and a memory region; further comprising:
    a logic device disposed over the logic region of the semiconductor substrate and including a logic interconnect structure thereover including the lower metal interconnect layer and the upper metal interconnect layer, wherein the logic interconnect structure includes a via arranged between the lower metal interconnect layer and the upper metal interconnect layer; and
    one or more memory cells disposed over the memory region of the semiconductor substrate and arranged between the lower metal interconnect layer and the upper metal interconnect layer;
    wherein a height of the memory cell over the memory region between the lower metal interconnect layer and the upper metal interconnect layer is equal to a height of the via over the logic region between the lower metal interconnect layer and the upper metal interconnect layer.

8. The IC of claim 1, further comprising:
    a non-magnetic capping layer disposed over and directly contacting the non-magnetic data storage or dielectric layer at an interface, wherein the bottom surfaces of the sidewall spacers are level with the interface at which the non-magnetic capping layer directly contacts the non-magnetic data storage or dielectric layer.

9. The IC of claim 1, wherein the non-magnetic data storage or dielectric layer has outer sidewalls that are aligned to corresponding outer sidewalls of the bottom electrode.

10. An integrated circuit (IC) including one or more memory cells arranged over a semiconductor substrate between an upper metal interconnect layer and a lower metal interconnect layer, a memory cell comprising:
    a bottom electrode disposed over the lower metal interconnect layer;
    a non-magnetic data storage or dielectric layer disposed over the bottom electrode and having outermost sidewalls aligned with outermost sidewalls of the bottom electrode;
    a top electrode disposed over the non-magnetic data storage or dielectric layer, wherein an upper surface of the top electrode is in direct contact with the upper metal interconnect layer without a via or contact coupling the upper surface of the top electrode to the upper metal interconnect layer; and
    sidewall spacers arranged along sidewalls of the top electrode, having bottom surfaces that rest on an upper surface of the non-magnetic data storage or dielectric layer, and having top surfaces that directly contact the upper metal interconnect layer,
    wherein the top electrode has an upper planar surface which extends continuously between the sidewalls of the top electrode and which directly abuts the upper metal interconnect layer.

11. The IC of claim 10, wherein the bottom electrode has sidewalls which are aligned with outer sidewalls of the sidewall spacers.

12. The IC of claim 10, wherein the bottom electrode has a bottom electrode width and the top electrode has a top electrode width that is smaller than the bottom electrode width.

13. The IC of claim 10, the one or more memory cells further comprising:
a capping layer disposed between the top electrode and the non-magnetic data storage or dielectric layer.

14. The IC of claim 10, further comprising: a conformal dielectric along outer sidewalls of the sidewall spacers and extending downward along outer sidewalls of the non-magnetic data storage or dielectric layer.

15. The IC of claim 10, wherein the semiconductor substrate includes a logic region and a memory region; further comprising:
a logic device disposed over the logic region of the semiconductor substrate and including a logic interconnect structure thereover including the lower metal interconnect layer and the upper metal interconnect layer, wherein the logic interconnect structure includes a via arranged between the lower metal interconnect layer and the upper metal interconnect layer; and
one or more memory cells disposed over the memory region of the semiconductor substrate and arranged between the lower metal interconnect layer and the upper metal interconnect layer;
wherein a height of the memory cell over the memory region between the lower metal interconnect layer and the upper metal interconnect layer is equal to a height of the via over the logic region between the lower metal interconnect layer and the upper metal interconnect layer.

16. An integrated circuit (IC) including one or more memory cells arranged over a semiconductor substrate between an upper metal interconnect layer and a lower metal interconnect layer, a memory cell comprising:
a bottom electrode disposed over the lower metal interconnect layer;
a metal oxide layer disposed over the bottom electrode;
a non-magnetic capping layer that directly contacts an upper surface of the metal oxide layer to define an interface;
a top electrode disposed over the non-magnetic capping layer, wherein an upper surface of the top electrode is in direct contact with the upper metal interconnect layer without a via or contact coupling the upper surface of the top electrode to the upper metal interconnect layer;
sidewall spacers arranged along sidewalls of the top electrode, having bottom surfaces that rest on an upper surface of the metal oxide layer and that are level with the interface at which the non-magnetic capping layer directly contacts the metal oxide layer, and top surfaces that directly contact the upper metal interconnect layer; and
wherein sidewalls of the non-magnetic capping layer are aligned with the sidewalls of the top electrode.

17. The IC of claim 16, the one or more memory cells further comprising: a conformal dielectric layer extending along the sidewalls of the top electrode, extending downwardly along the sidewalls of the non-magnetic capping layer, along sidewalls of the metal oxide layer, and along upper sidewalls of the bottom electrode.

18. The IC of claim 16, wherein the bottom electrode has sidewalls which are aligned with outer sidewalls of the sidewall spacers.

19. The IC of claim 16, wherein the semiconductor substrate includes a logic region and a memory region; further comprising:
a logic device disposed over the logic region of the semiconductor substrate and including a logic interconnect structure thereover including the lower metal interconnect layer and the upper metal interconnect layer, wherein the logic interconnect structure includes a via arranged between the lower metal interconnect layer and the upper metal interconnect layer; and
one or more memory cells disposed over the memory region of the semiconductor substrate and arranged between the lower metal interconnect layer and the upper metal interconnect layer;
wherein a height of the memory cell over the memory region between the lower metal interconnect layer and the upper metal interconnect layer is equal to a height of the via over the logic region between the lower metal interconnect layer and the upper metal interconnect layer.

20. The IC of claim 16:
wherein the top electrode and the bottom electrode are made of platinum, aluminum copper, titanium nitride, gold, titanium, tantalum, tantalum nitride, tungsten, tungsten nitride, or copper; and
wherein the metal oxide layer is made of nickel oxide (NiO), titanium oxide (TiO), hafnium oxide (HfO), zirconium oxide (ZrO), zinc oxide (ZnO), tungsten oxide ($WO_3$), aluminum oxide ($Al_2O_3$), tantalum oxide (TaO), molybdenum oxide (MoO), or copper oxide (CuO).

* * * * *